US012771278B2

(12) United States Patent
Tsai

(10) Patent No.: US 12,771,278 B2
(45) Date of Patent: Oct. 20, 2026

(54) MOTOR DRIVER FOR SETTING DUTY CYCLES BASED ON TEMPERATURE

(71) Applicant: ANPEC ELECTRONICS CORPORATION, Hsinchu (TW)

(72) Inventor: Ming-Jung Tsai, Changhua County (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 209 days.

(21) Appl. No.: 18/947,312

(22) Filed: Nov. 14, 2024

(65) Prior Publication Data

US 2026/0081552 A1 Mar. 19, 2026

(30) Foreign Application Priority Data

Sep. 13, 2024 (TW) ................................ 113134749

(51) Int. Cl.
*H02P 29/60* (2016.01)
*H02K 11/25* (2016.01)
*H03K 7/08* (2006.01)

(52) U.S. Cl.
CPC .............. *H02P 29/60* (2016.02); *H02K 11/25* (2016.01); *H03K 7/08* (2013.01); *H02P 2209/13* (2013.01)

(58) Field of Classification Search
CPC ........ H02P 29/60; H02P 2209/13; H02P 6/20; H02P 29/68; H02P 1/04; H02K 11/25; H03K 7/08
USPC ........................................ 318/445, 599, 560
See application file for complete search history.

(56) References Cited

U.S. PATENT DOCUMENTS 10,044,314 B1 * 8/2018 Yen .......................... H02P 6/14

FOREIGN PATENT DOCUMENTS

CN 117013884 A 11/2023

* cited by examiner

*Primary Examiner* — David Luo
(74) *Attorney, Agent, or Firm* — Li & Cai Intellectual Property (USA) Office

(57) ABSTRACT

A motor driver for setting duty cycles based on a temperature is provided. The motor driver senses a temperature of an environment around a motor. The motor driver sets a duty cycle modulation value according to the sensed temperature, and modulates a preset duty cycle to form a startup duty cycle according to the duty cycle modulation value. The motor driver sets or modulates duty cycles of one or more waveforms of a startup signal to be equal to the startup duty cycle. The motor driver outputs the startup signal to the motor.

18 Claims, 11 Drawing Sheets

MOTOR DRIVER FOR SETTING DUTY CYCLES BASED ON TEMPERATURE

CROSS-REFERENCE TO RELATED PATENT APPLICATION

This application claims the benefit of priority to Taiwan Patent Application No. 113134749, filed on Sep. 13, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is “prior art” to the disclosure described herein. All references cited and discussed in this specification are incorporated herein by reference in their entireties and to the same extent as if each reference was individually incorporated by reference.

FIELD OF THE DISCLOSURE

The present disclosure relates to a motor driver, and more particularly to a motor driver for setting duty cycles based on a temperature.

BACKGROUND OF THE DISCLOSURE

Fans are often used to cool down processors and other heat-generating components in electronic devices. However, when the fans are disposed in a low temperature environment, lubricant between bearings and balls of motors of the fans can solidify, such that the bearings and balls are stuck together by the solidified lubricant. Under this condition, conventional motor drivers are unable to successfully startup the motors.

SUMMARY OF THE DISCLOSURE

In response to the above-referenced technical inadequacies, the present disclosure provides a motor driver for setting duty cycles based on a temperature. The motor driver includes a temperature sensor, a temperature duty cycle modulating circuit, a startup duty cycle setting circuit, a startup signal generating circuit and a driver circuit. The temperature sensor is configured to sense a temperature of a motor or an environment around the motor as a sensed temperature, and output a temperature sensed signal according to the sensed temperature. The temperature duty cycle modulating circuit is connected to the temperature sensor. The temperature duty cycle modulating circuit is configured to output a duty cycle modulation instructing signal according to the temperature sensed signal. The startup duty cycle setting circuit is connected to the temperature duty cycle modulating circuit. The startup duty cycle setting circuit is configured to modulate a preset duty cycle to form a startup duty cycle according to the duty cycle modulation instructing signal, and output a startup duty cycle instructing signal according to the startup duty cycle. The startup signal generating circuit is connected to the startup duty cycle setting circuit. The startup signal generating circuit is configured to set or modulate duty cycles of one or more of a plurality of waveforms of a startup signal to be equal to the startup duty cycle according to the startup duty cycle instructing signal. The driver circuit is connected to the startup signal generating circuit. The driver circuit is configured to output a driving signal to the motor according to the startup signal.

As described above, the present disclosure provides the motor driver for setting the duty cycles based on the temperature. The motor driver of the present disclosure, according the sensed temperature of the motor or the environment around the motor, modulates the driving signal outputted to the motor for adjusting thrust force applied on the motor. In particular, when lubricant between mechanical components such as bearings and balls of the motor is solidified and the mechanical components are stuck together by the solidified lubricant at a low temperature, the motor driver of the present disclosure applies much larger thrust force on the motor for successfully starting up the motor and driving the motor to rotate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
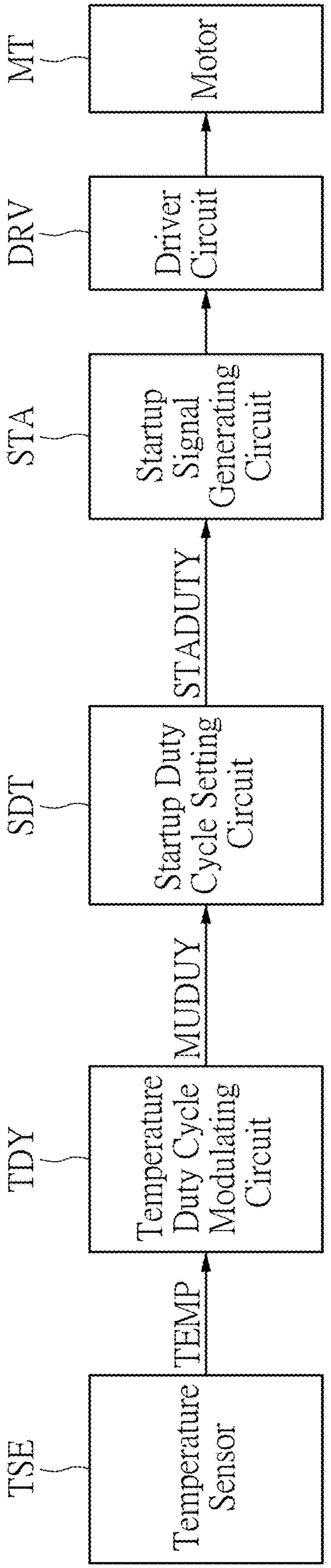
FIG. 1 is a block diagram of a motor driver for setting duty cycles based on a temperature according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
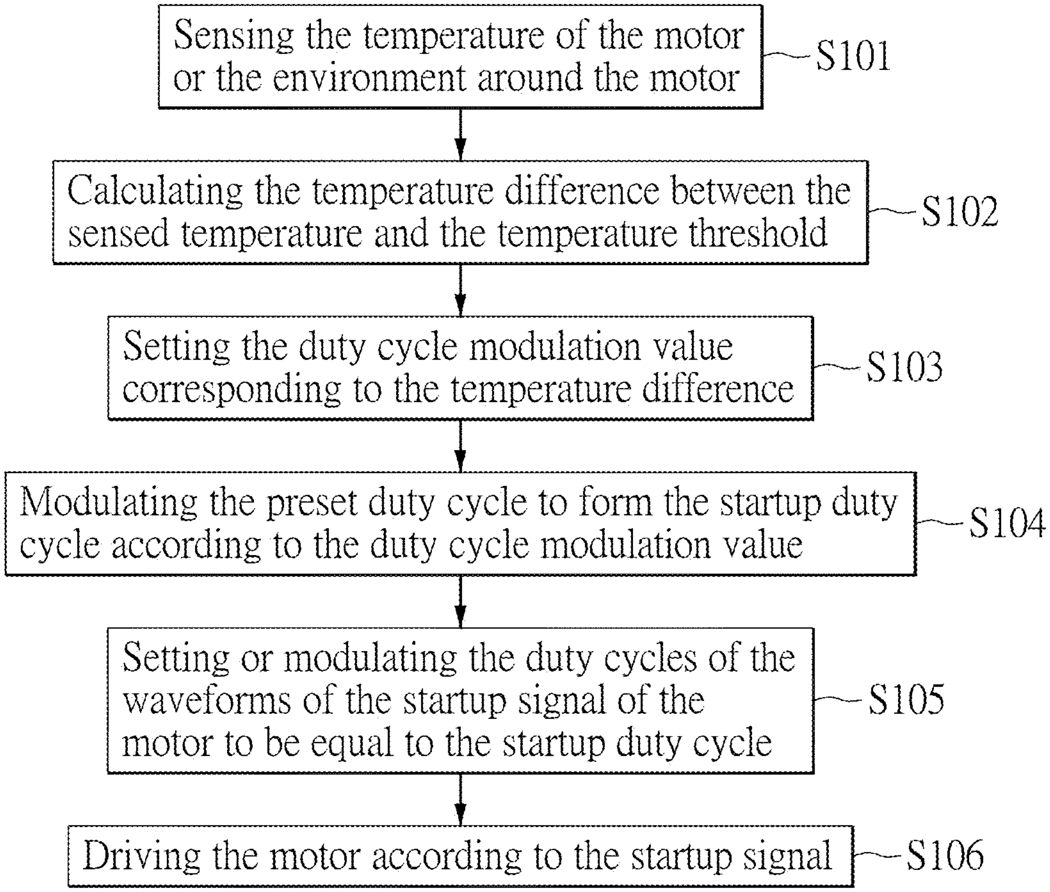
FIG. 2 is a flowchart diagram of processes of a motor driving method for setting the duty cycles based on the temperature according to the first embodiment of the present disclosure.

Reference is made to FIG. 1 and FIG. 2, in which FIG. 1 is a block diagram of a motor driver for setting duty cycles based on a temperature according to a first embodiment of the present disclosure, and FIG. 2 is a flowchart diagram of processes of a motor driving method for setting the duty cycles based on the temperature according to the first embodiment of the present disclosure.

Figure 4:
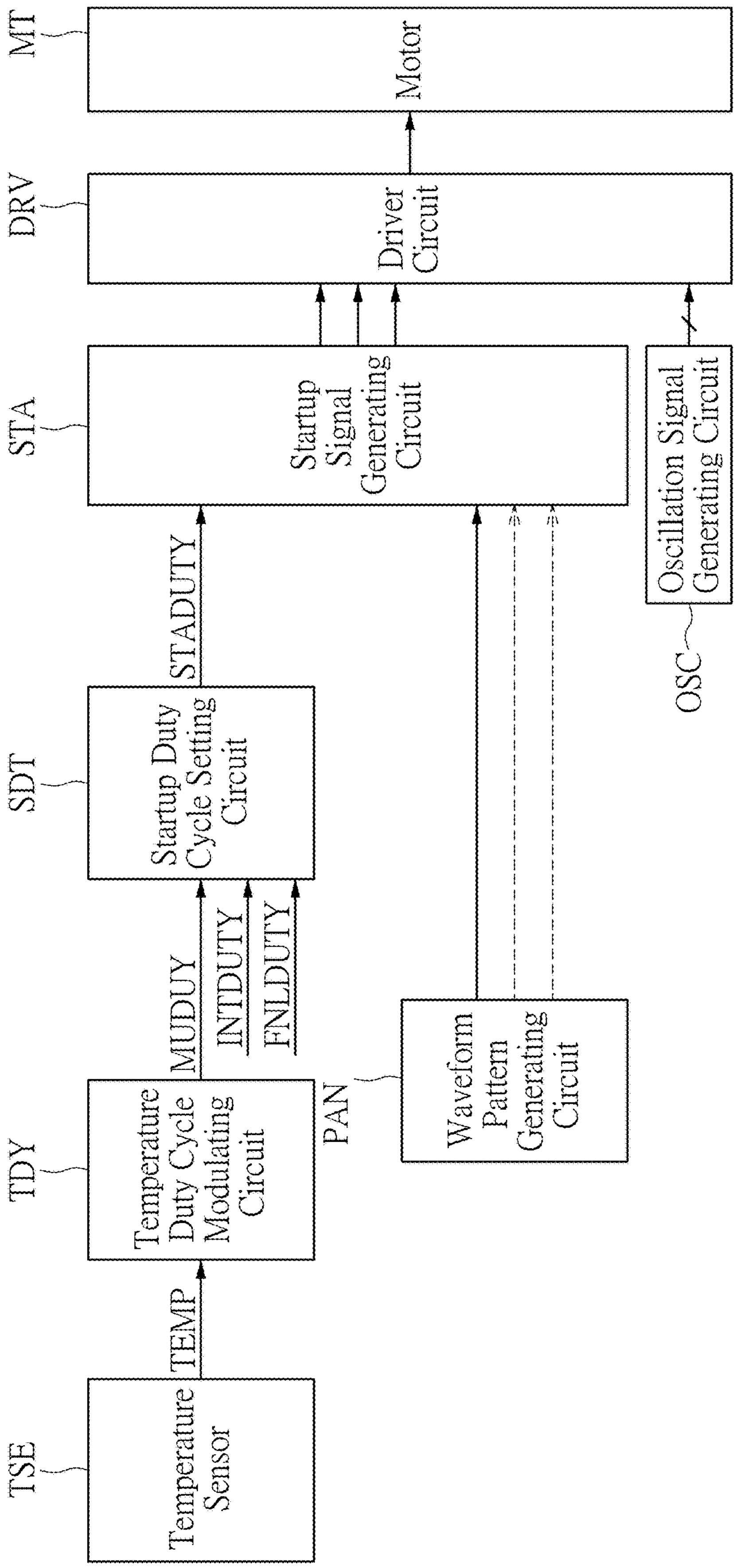
FIG. 4 is a block diagram of a motor driver for setting duty cycles based on a temperature according to a third embodiment of the present disclosure.

The motor driving method of the present disclosure may include steps S101 to S106 shown in FIG. 2 and may be performed by the motor driver of the present disclosure as shown in FIG. 1 or FIG. 4.

In the first embodiment, the motor driver of the present disclosure includes a temperature sensor TSE, a temperature duty cycle modulating circuit TDY, a startup duty cycle setting circuit SDT, a startup signal generating circuit STA, and a driver circuit DRV as shown in FIG. 1.

In the motor driver of the present disclosure, each of circuit components such as the temperature sensor TSE, the temperature duty cycle modulating circuit TDY, the startup duty cycle setting circuit SDT, the startup signal generating circuit STA and the driver circuit DRV as described herein may include one or more hardware components. For example, the temperature sensor TSE includes a thermistor, a thermocouple or other hardware components having a temperature sensing function. For example, the temperature duty cycle modulating circuit TDY and the startup duty cycle setting circuit SDT, the startup signal generating circuit STA may be included in a processor or other circuit hardware device having the same functions. The driver circuit DRV may include a plurality of high-side switches and a plurality of low-side switches. A first terminal of each of the plurality of high-side switches is coupled with a common voltage. Second terminals of the plurality of high-side switches are respectively connected to first terminals of the plurality of low-side switches. The driver circuit DRV is connected to a control terminal of each of the plurality of high-side switches and a control terminal of each of the plurality of low-side switches.

As shown in FIG. 1, the temperature duty cycle modulating circuit TDY is connected to the temperature sensor TSE and the startup duty cycle setting circuit SDT. The startup signal generating circuit STA is connected to the startup duty cycle setting circuit SDT and the driver circuit DRV. The driver circuit DRV is connected to a motor MT. The motor MT described herein may be a single-phase motor or a three-phase motor.

The temperature sensor TSE senses a temperature of the motor MT or an environment around the motor MT as a sensed temperature (in process S101 shown in FIG. 2), and outputs a temperature sensed signal TEMP according to the sensed temperature.

The temperature duty cycle modulating circuit TDY obtains the sensed temperature instructed by the temperature sensed signal TEMP from the temperature sensor TSE, and outputs a duty cycle modulation instructing signal MUDUY according to the sensed temperature. For example, the temperature duty cycle modulating circuit TDY may calculate a temperature difference between the sensed temperature and a temperature threshold (in process S102 shown in FIG. 2), may set a duty cycle modulation value corresponding to the temperature difference (in process S103 shown in FIG. 2), and may output the duty cycle modulation instructing signal MUDUY according to the duty cycle modulation value. That is, duty cycles are modulated with a change in the sensed temperature.

The startup duty cycle setting circuit SDT modulates a preset duty cycle to form a startup duty cycle according to the duty cycle modulation value instructed by the duty cycle modulation instructing signal MUDUY from the temperature duty cycle modulating circuit TDY (in process S104 shown in FIG. 2). The startup duty cycle setting circuit SDT outputs a startup duty cycle instructing signal STADUTY according to the startup duty cycle.

The startup signal generating circuit STA, according to the startup duty cycle instructed by the startup duty cycle instructing signal STADUTY from the startup duty cycle setting circuit SDT, sets or modulates duty cycles of one or more of a plurality of waveforms of a startup signal to be equal to the startup duty cycle (in process S105 shown in FIG. 2).

The driver circuit DRV, according to the startup signal from the startup signal generating circuit STA, outputs a driving signal to the motor MT for starting up the motor MT and driving the motor MT to rotate (in process S106 shown in FIG. 2).

That is, the motor driver of the present disclosure modulates driving of the motor MT according to the temperature of the motor MT or the environment around the motor MT. As a result, thrust force applied on the motor MT is changed with a change in the temperature of the motor MT or the environment around the motor MT. Therefore, no matter how the temperature changes, the motor driver of the present disclosure is capable of applying appropriate thrust force on the motor MT to successfully drive the motor MT to rotate in a desired state. In particular, when the temperature of the motor MT or the environment around the motor MT is reduced to a low temperature value such that bearings and balls of the motor are stuck together together through solidified lubricant, the motor driver of the present disclosure is still capable of successfully starting up the motor.

Figure 3:
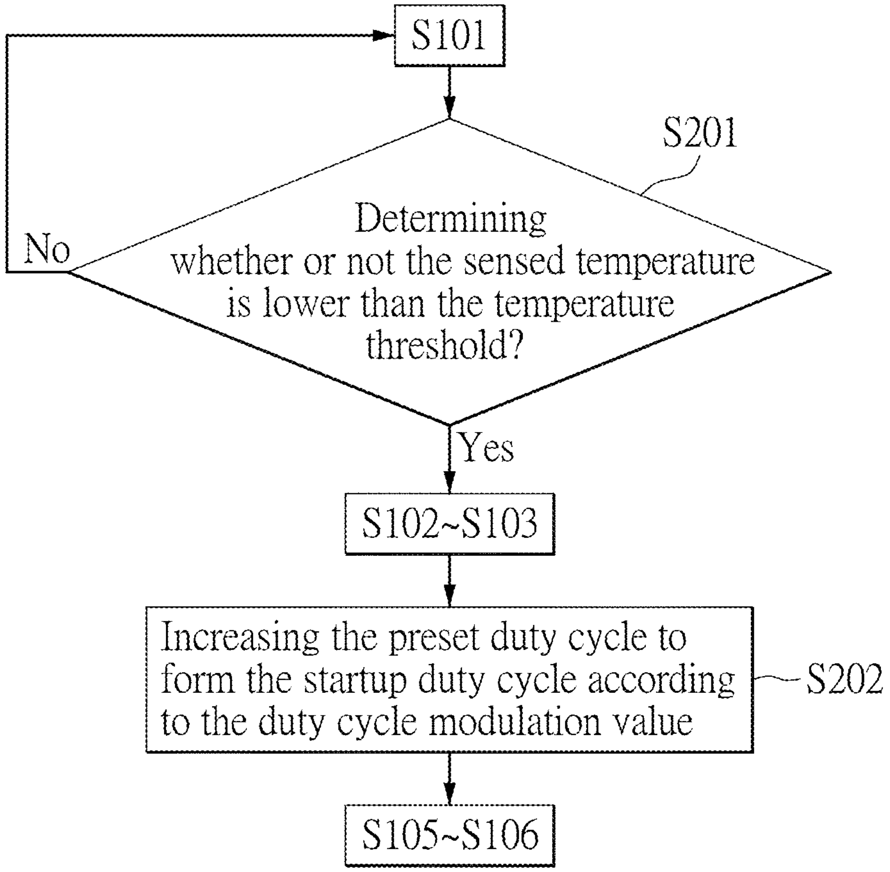
FIG. 3 is a flowchart diagram of increasing duty cycles of a driving signal for starting up a motor in a low temperature environment in a motor driving method for setting the duty cycles based on a temperature according to a second embodiment of the present disclosure.

Reference is made to FIG. 3, which is a flowchart diagram of increasing duty cycles of a driving signal for starting up a motor in a low temperature environment in a motor driving method for setting the duty cycles based on a temperature according to a second embodiment of the present disclosure.

The motor driving method of the present disclosure may further include processes S201 to S202 shown in FIG. 3 and may be performed by the motor driver of the present disclosure as shown in FIG. 1 or FIG. 4.

After the temperature sensor TSE senses the temperature of the motor MT or the environment around the motor MT as the sensed temperature (in process S101 shown in FIG. 2), the temperature duty cycle modulating circuit TDY determines whether or not the sensed temperature is lower than the temperature threshold to output the duty cycle modulation instructing signal MUDUY (in process S201 shown in FIG. 3).

When the sensed temperature of the motor MT or the environment around the motor MT is not lower than the temperature threshold, the temperature duty cycle modulating circuit TDY does not calculate the temperature difference between the sensed temperature and the temperature threshold (in process S102 shown in FIG. 2), and does not further set and output the duty cycle modulation value corresponding to the temperature difference (or, in practice, outputs the duty cycle modulation value that is a zero value). Further, when the startup duty cycle setting circuit SDT does not receive the duty cycle modulation value in the process S103 shown in FIG. 2 (or receives the duty cycle modulation value that is the zero value in practice), the startup duty cycle setting circuit SDT does not modulate the preset duty cycle (in process S103 shown in FIG. 2). At this time, the temperature sensor TSE may continually sense the temperature of the motor MT or the environment around the motor MT (in process S101 shown in FIG. 2 and FIG. 3).

Conversely, when the sensed temperature of the motor MT or the environment around the motor MT is lower than the temperature threshold, the duty cycle modulation value instructed in the duty cycle modulation instructing signal MUDUY received from the temperature duty cycle modulating circuit TDY by the startup duty cycle setting circuit SDT is not the zero value. At this time, the startup duty cycle setting circuit SDT increases the preset duty cycle according to the duty cycle modulation value, and uses the increased preset duty cycle as the startup duty cycle (in process S202 shown in FIG. 2).

After the startup duty cycle setting circuit SDT sets the startup duty cycle (in process S202 shown in FIG. 2), the startup signal generating circuit STA sets or modulates the duty cycles of one or more of the plurality of waveforms of the startup signal to be equal to the startup duty cycle (in process S105 shown in FIG. 2 and FIG. 3). Then, the driver circuit DRV outputs the driving signal to the motor MT according to the startup signal for starting up the motor MT and driving the motor MT to rotate (in process S106 shown in FIG. 2 and FIG. 3).

When the temperature of the motor MT or the environment around the motor MT is too low (e.g., lower than the temperature threshold), the lubricant between mechanical components such as the bearings and the balls of the motor MT is solidified, and the mechanical components are stuck together by the solidified lubricant such that the mechanical components cannot normally operate. Under this condition, the motor driver of the present disclosure applies a much larger thrust force on the motor MT for successfully starting up the motor.

Reference is made to FIG. 4, which is a block diagram of a motor driver for setting duty cycles based on a temperature according to a third embodiment of the present disclosure.

As shown in FIG. 4, in the third embodiment, the motor driver of the present disclosure not only includes the temperature sensor TSE, the temperature duty cycle modulating circuit TDY, the startup duty cycle setting circuit SDT, the startup signal generating circuit STA and the driver circuit DRV, but also includes a waveform pattern generating circuit PAN and an oscillation signal generating circuit OSC.

As shown in FIG. 4, the temperature duty cycle modulating circuit TDY is connected to the temperature sensor TSE and the startup duty cycle setting circuit SDT. The startup signal generating circuit STA is connected to the startup duty cycle setting circuit SDT, the waveform pattern generating circuit PAN and the driver circuit DRV. The driver circuit DRV is connected to the oscillation signal generating circuit OSC and the motor MT.

The temperature duty cycle modulating circuit TDY may set a plurality of duty cycle modulation values according to the temperature difference between the sensed temperature and the temperature threshold. Then, the temperature duty cycle modulating circuit TDY may output the duty cycle modulation instructing signal MUDUY according to the plurality of duty cycle modulation values.

For example, the plurality of duty cycle modulation values instructed by the duty cycle modulation instructing signal MUDUY may include an initial duty cycle modulation value, a final duty cycle modulation value or a combination thereof.

Then, the startup duty cycle setting circuit SDT may modulate an initial duty cycle INTDUTY to form an initial startup duty cycle, according to the initial duty cycle modulation value instructed by the duty cycle modulation instructing signal MUDUY from the temperature duty cycle modulating circuit TDY. In addition or alternatively, the startup duty cycle setting circuit SDT may modulate a final duty cycle FNLDUTY to form a final startup duty cycle according to the final duty cycle modulation value instructed by the duty cycle modulation instructing signal MUDUY.

A duty cycle of an earliest one or each of earliest ones of a plurality of waveforms of the startup duty cycle instructing signal STADUTY outputted by the startup signal generating circuit SDT is equal to the initial startup duty cycle. In addition or alternatively, a duty cycle of a latest one or each of latest ones of the plurality of waveforms of the startup duty cycle instructing signal STADUTY is equal to the final startup duty cycle.

The startup signal generating circuit STA may, according to the initial startup duty cycle and the final startup duty cycle of ones of the plurality of waveforms of the startup duty cycle instructing signal STADUTY, set duty cycles of other ones of the plurality of waveforms of the startup duty cycle instructing signal STADUTY. Each of the other duty cycles falls within a range of the initial startup duty cycle to the final startup duty cycle.

The waveform pattern generating circuit PAN may store a plurality of reference pattern waveform signals.

The startup signal generating circuit STA, according to the plurality of waveforms of the startup signal STADUTY from the startup signal generating circuit SDT, modulates a plurality of waveforms of the plurality of reference pattern waveform signals from the waveform pattern generating circuit PAN to output a plurality of startup signals.

The driver circuit DRV compares voltage levels of a plurality of waveforms of the plurality of startup signals from the startup signal generating circuit STA respectively with voltage levels of a plurality of waveforms of an oscillation signal from the oscillation signal generating circuit OSC to determine duty cycles of a plurality of waveforms of the driving signal.

The driver circuit DRV outputs the driving signal to the motor MT for starting up the motor MT and driving the motor MT to rotate.

Figure 5:
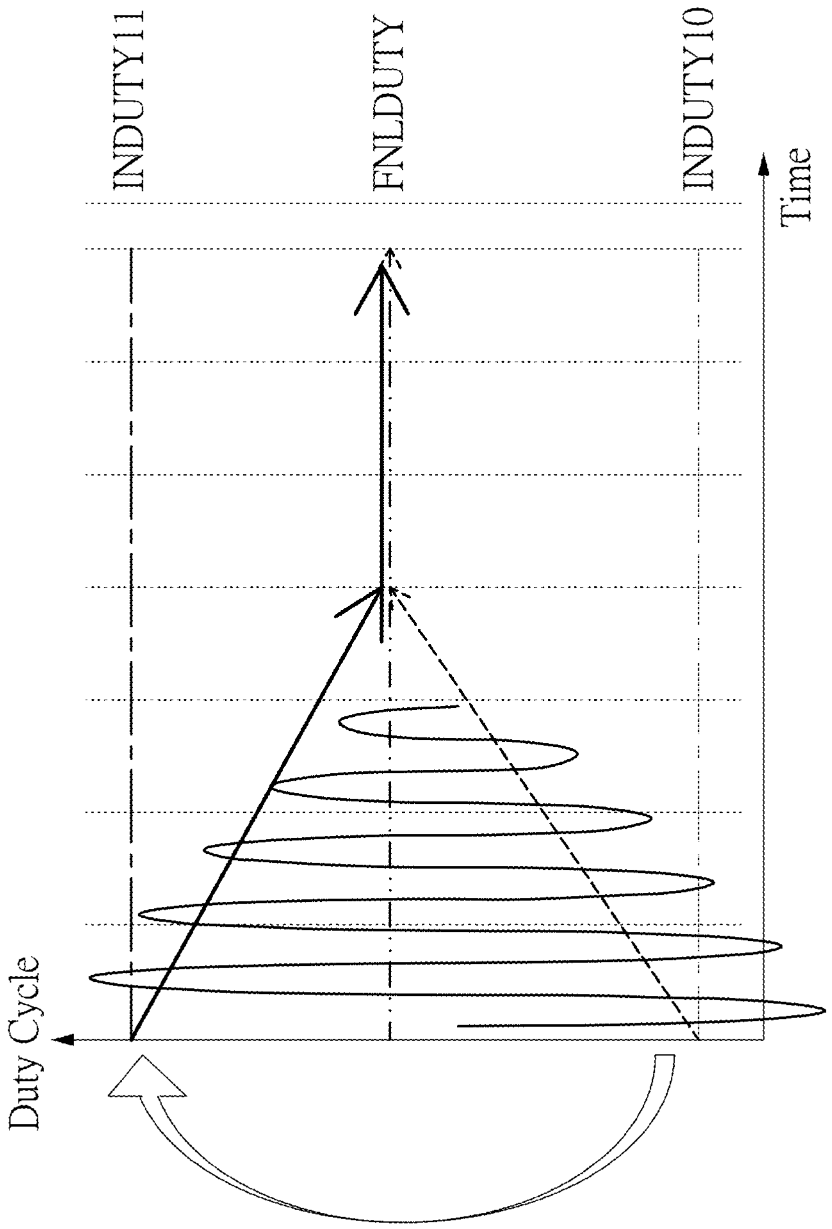
FIG. 5 is a schematic diagram of initial duty cycles of a plurality of waveforms of a driving signal that is modulated over time and outputted by the motor driver according to a fourth embodiment of the present disclosure.

Reference is made to FIG. 5, which is a schematic diagram of initial duty cycles of a plurality of waveforms of a driving signal that is modulated over time and outputted by the motor driver according to a fourth embodiment of the present disclosure.

The startup duty cycle setting circuit SDT may modulate the initial duty cycle INTDUTY from a first initial ratio INDUTY10 to a second initial ratio INDUTY11 as shown in FIG. 5.

Figure 6:
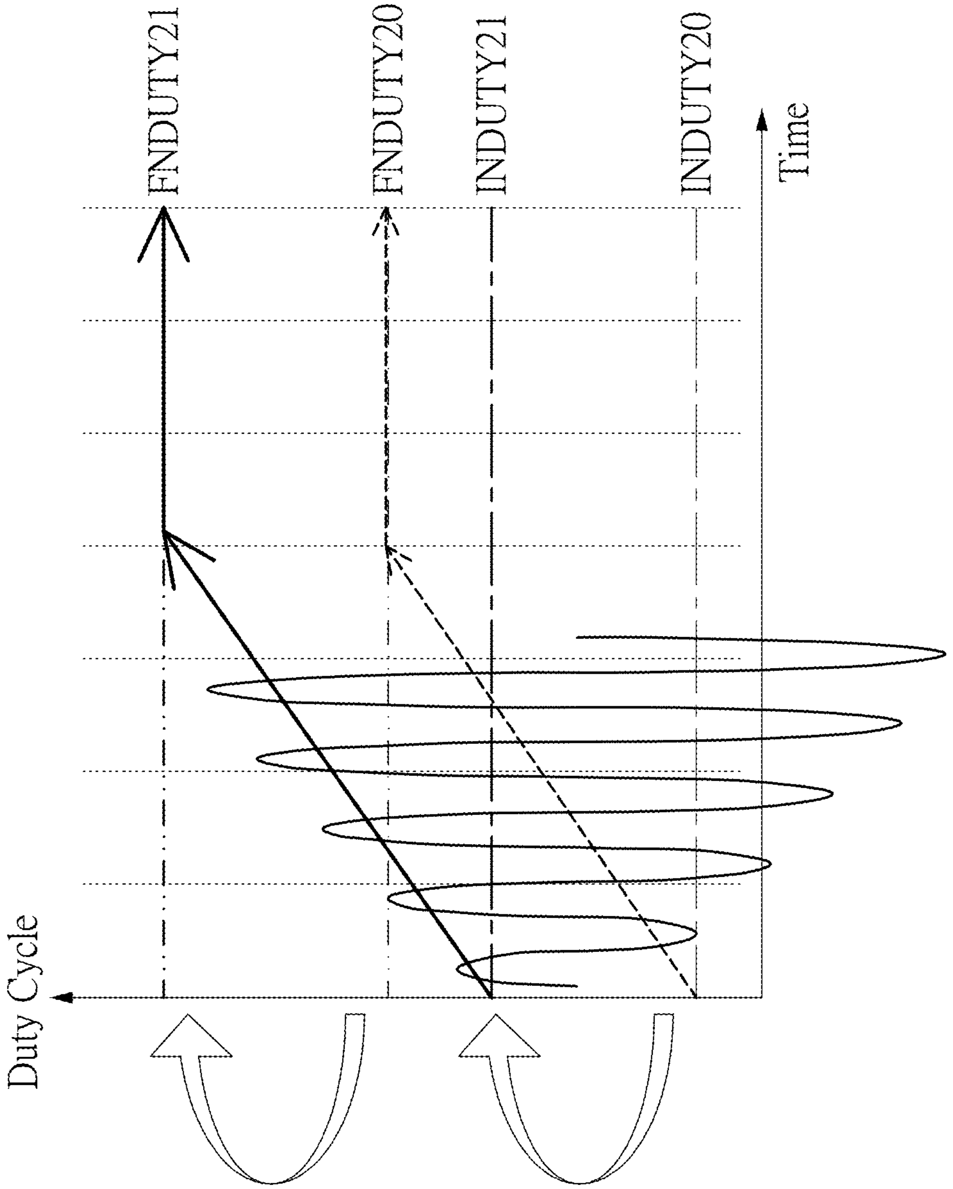
FIG. 6 is a schematic diagram of initial duty cycles and final duty cycles of a plurality of waveforms of a driving signal that is modulated over time and outputted by the motor driver according to a fifth embodiment of the present disclosure.

Reference is made to FIG. 6, which is a schematic diagram of initial duty cycles and final duty cycles of a plurality of waveforms of a driving signal that is modulated over time and outputted by the motor driver according to a fifth embodiment of the present disclosure.

The startup duty cycle setting circuit SDT may modulate the initial duty cycle INTDUTY from a first initial ratio INDUTY20 to a second first initial ratio INDUTY21 as shown in FIG. 6, and may modulate the final duty cycle FNLDUTY from a first final ratio FNLDUTY20 to a second final ratio FNLDUTY21 as shown in FIG. 6.

Figure 7:
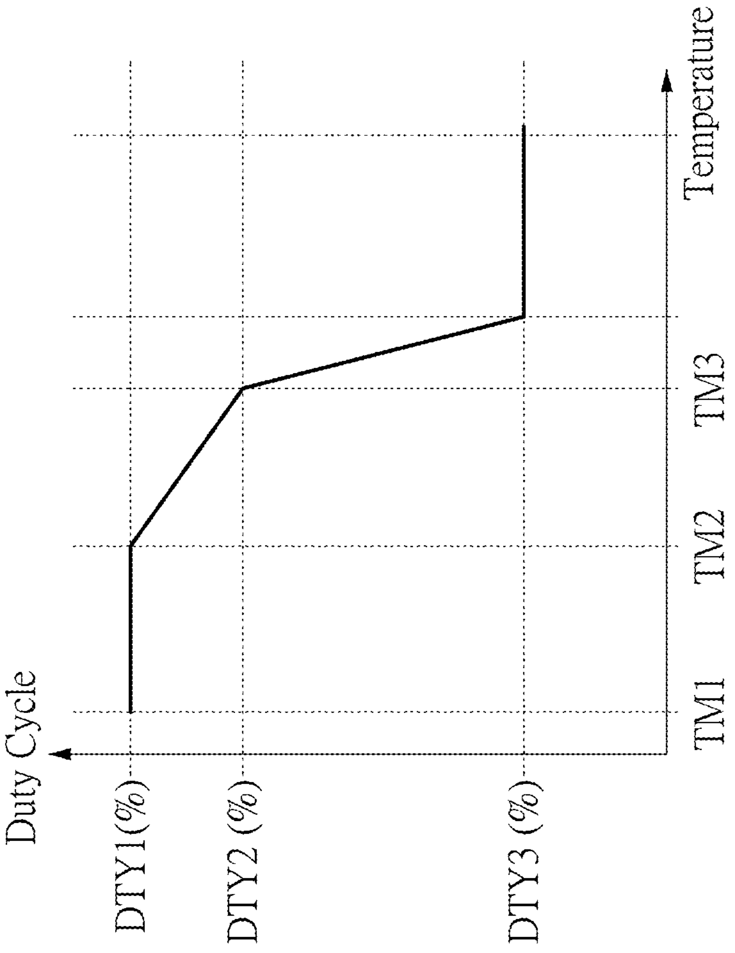
FIG. 7 is a schematic diagram of a plurality of temperatures that correspond respectively to a plurality of duty cycles set by the motor driver according to a sixth embodiment of the present disclosure.

Reference is made to FIG. 7, which is a schematic diagram of a plurality of temperatures that correspond respectively to a plurality of duty cycles set by the motor driver according to a sixth embodiment of the present disclosure.

The temperature duty cycle modulating circuit TDY shown in FIG. 1 or FIG. 4 may set a plurality of reference modulation temperatures and a plurality of reference modulation duty cycles. The plurality of reference modulation duty cycles correspond respectively to the plurality of reference modulation temperatures. For example, as shown in FIG. 7, a plurality of reference modulation temperatures TM1, TM2, TM3 correspond respectively to a plurality of reference modulation duty cycles DTY1, DTY2, DTY3. The reference modulation duty cycles having different ratios correspond respectively to the plurality of reference modulation temperatures having different values. The lower the temperature is, the stronger the viscosity of the lubricant between the bearings and the balls of the motor is, and the larger the reference modulation duty cycle that is required for increasing the thrust force applied on the motor MT to successfully start up thrust the motor MT.

After the temperature duty cycle modulating circuit TDY shown in FIG. 1 or FIG. 4 obtains the sensed temperature of the motor MT or the environment around the motor MT from the temperature sensor TSE, the temperature duty cycle modulating circuit TDY calculates the temperature difference between the sensed temperature and the temperature threshold. Then, the temperature duty cycle modulating circuit TDY may compare the temperature difference respectively with the plurality of reference modulation temperatures to determine which one of the plurality of reference modulation temperatures is equal to the temperature difference, and obtains the reference modulation duty cycle corresponding to the one of the plurality of reference modulation temperature. Then, the temperature duty cycle modulating circuit TDY may output the duty cycle modulation instructing signal MUDUY instructing the obtained reference modulation duty cycle to the startup duty cycle setting circuit SDT.

If necessary, the temperature duty cycle modulating circuit TDY may, according to the plurality of reference modulation temperatures and the plurality of reference modulation duty cycles, establish a curve graph and construct a curve in the curve graph. The temperature duty cycle modulating circuit TDY may, on the curve in the curve graph, look for the reference modulation duty cycle corresponding to the reference modulation temperature being equal to the temperature difference as the duty cycle modulation value, and may output the duty cycle modulation instructing signal MUDUY instructing the duty cycle modulation value.

Then, the startup duty cycle setting circuit SDT modulates the preset duty cycle to form the startup duty cycle according to the duty cycle modulation value instructed by the duty cycle modulation instructing signal MUDUY. Then, the startup duty cycle setting circuit SDT outputs the startup duty cycle instructing signal STADUTY according to the startup duty cycle.

Then, the startup signal generating circuit STA, according to the startup duty cycle instructed by the startup duty cycle instructing signal STADUTY, sets or modulates the duty cycles of one or more of the plurality of waveforms of the startup signal to be equal to the startup duty cycle.

Finally, the driver circuit DRV, according to the startup signal, outputs the driving signal to the motor MT for starting up the motor MT and driving the motor MT to rotate (in the process S106 shown in FIG. 2).

Figure 8:
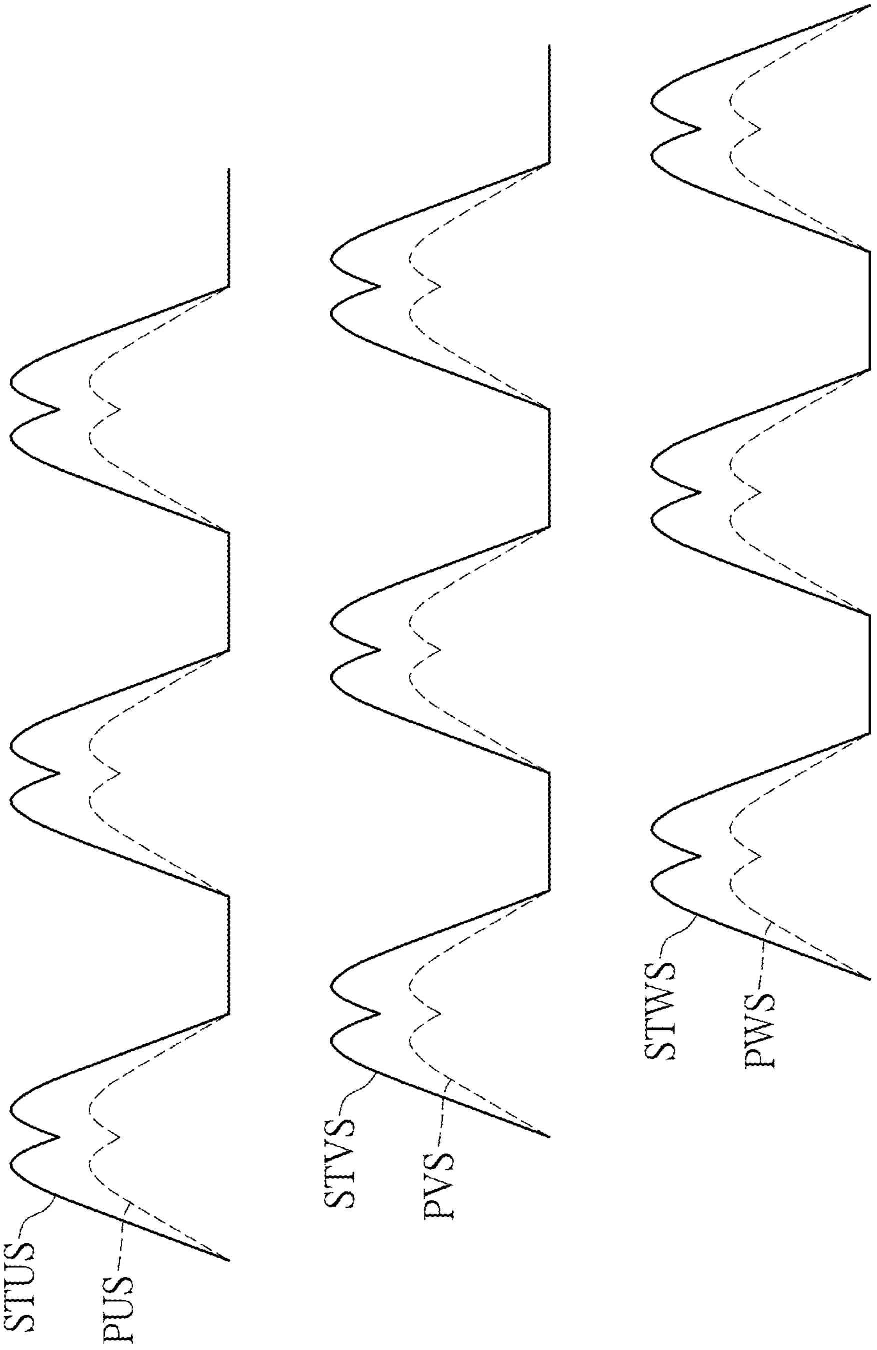
FIG. 8 is a waveform diagram of a plurality of reference pattern waveform signals of the motor driver according to a seventh embodiment of the present disclosure.
Figure 9:
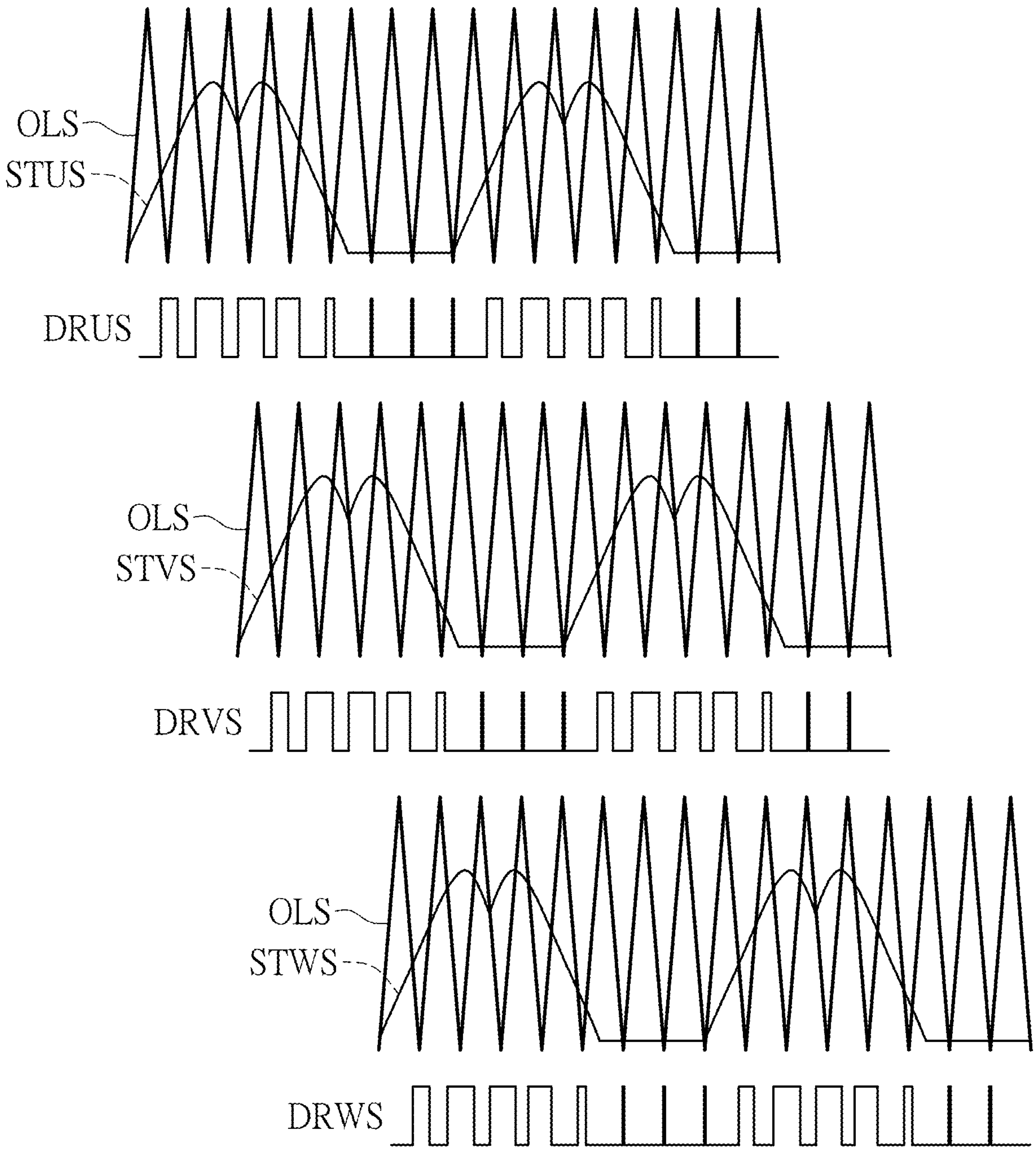
FIG. 9 is a waveform diagram of the plurality of reference pattern waveform signals, an oscillation signal and a driving signal of the motor driver according to the seventh embodiment of the present disclosure.

Reference is made to FIG. 8 and FIG. 9, in which FIG. 8 is a waveform diagram of a plurality of reference pattern waveform signals of the motor driver according to a seventh embodiment of the present disclosure, and FIG. 9 is a waveform diagram of the plurality of reference pattern waveform signals, an oscillation signal and a driving signal of the motor driver according to the seventh embodiment of the present disclosure.

For example, the plurality of reference pattern waveform signals outputted by the waveform pattern generating circuit PAN shown in FIG. 4 may be the same as a plurality of reference pattern waveform signals PUS, PVS, PWS each including a plurality of third harmonic waveforms as shown in FIG. 8. In practice, each of the plurality of reference pattern waveform signals may include a plurality of sine waveforms.

The startup signal generating circuit STA may, according to the startup duty cycle instructing signal STADUTY from the startup duty cycle setting circuit SDT, modulate the plurality of reference pattern waveform signals PUS, PVS, PWS to form a plurality of startup signals STUS, STVS, STWS as shown in FIG. 8.

For example, the oscillation signal that is received from the oscillation signal generating circuit OSC by the driver circuit DRV may be the same as an oscillation signal OLS shown in FIG. 9. The oscillation signal OLS includes a plurality of triangular waveforms. In practice, the oscillation signal may include a plurality of sawtooth waveforms.

The driver circuit DRV may compare voltages of a plurality of waveforms of the plurality of startup signals STUS, STVS, STWS respectively with voltages of a plurality of waveforms of the oscillation signal OLS to determine duty cycles of a plurality of waveforms of a plurality of driving signals DRUS, DRVS, DRWS. The driver circuit DRV may output the plurality of driving signals DRUS, DRVS, DRWS to the motor MT.

Figure 10:
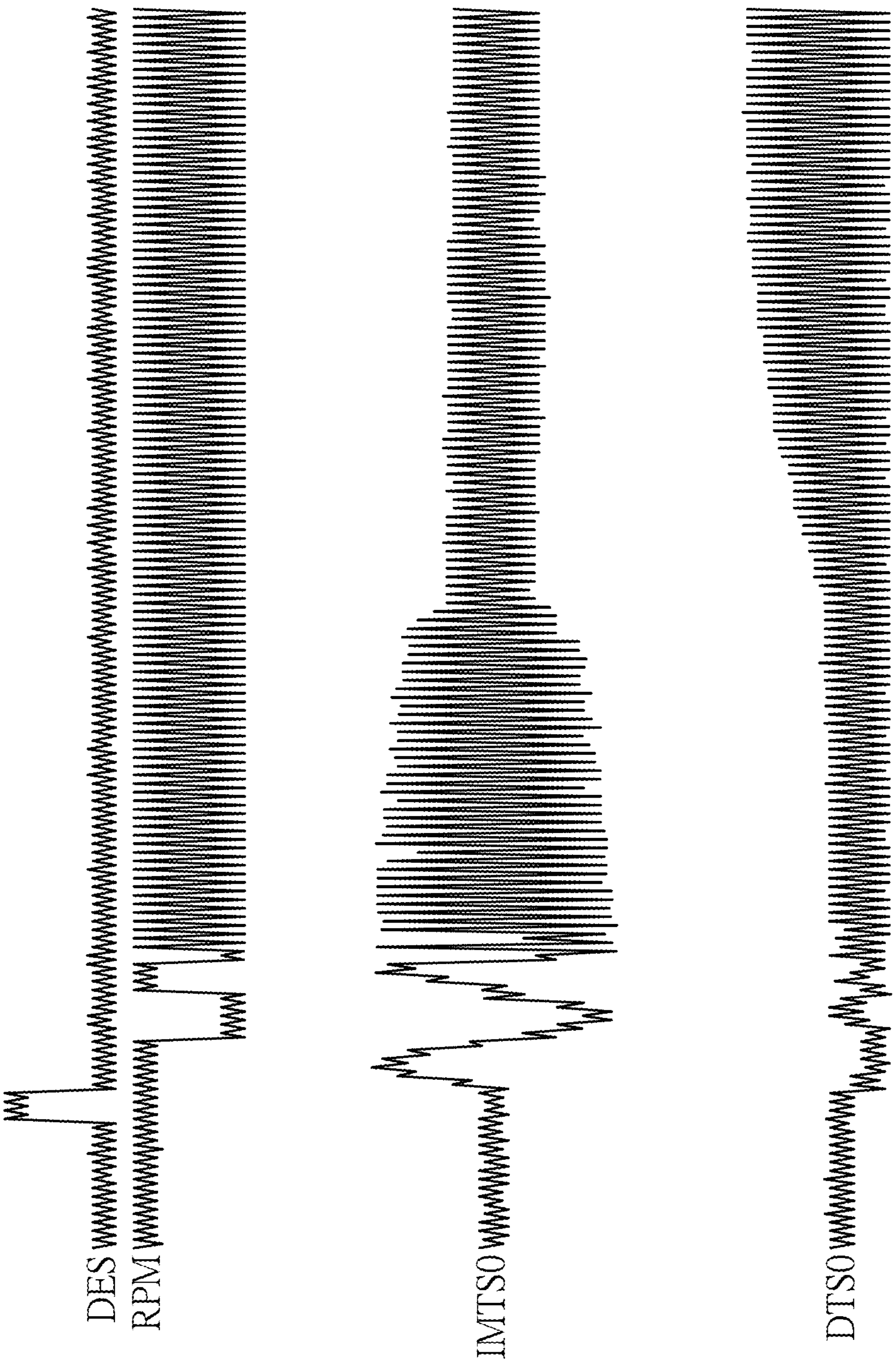
FIG. 10 is a waveform diagram of signals generated at a room temperature by the motor driver according to an eighth embodiment of the present disclosure.
Figure 11:
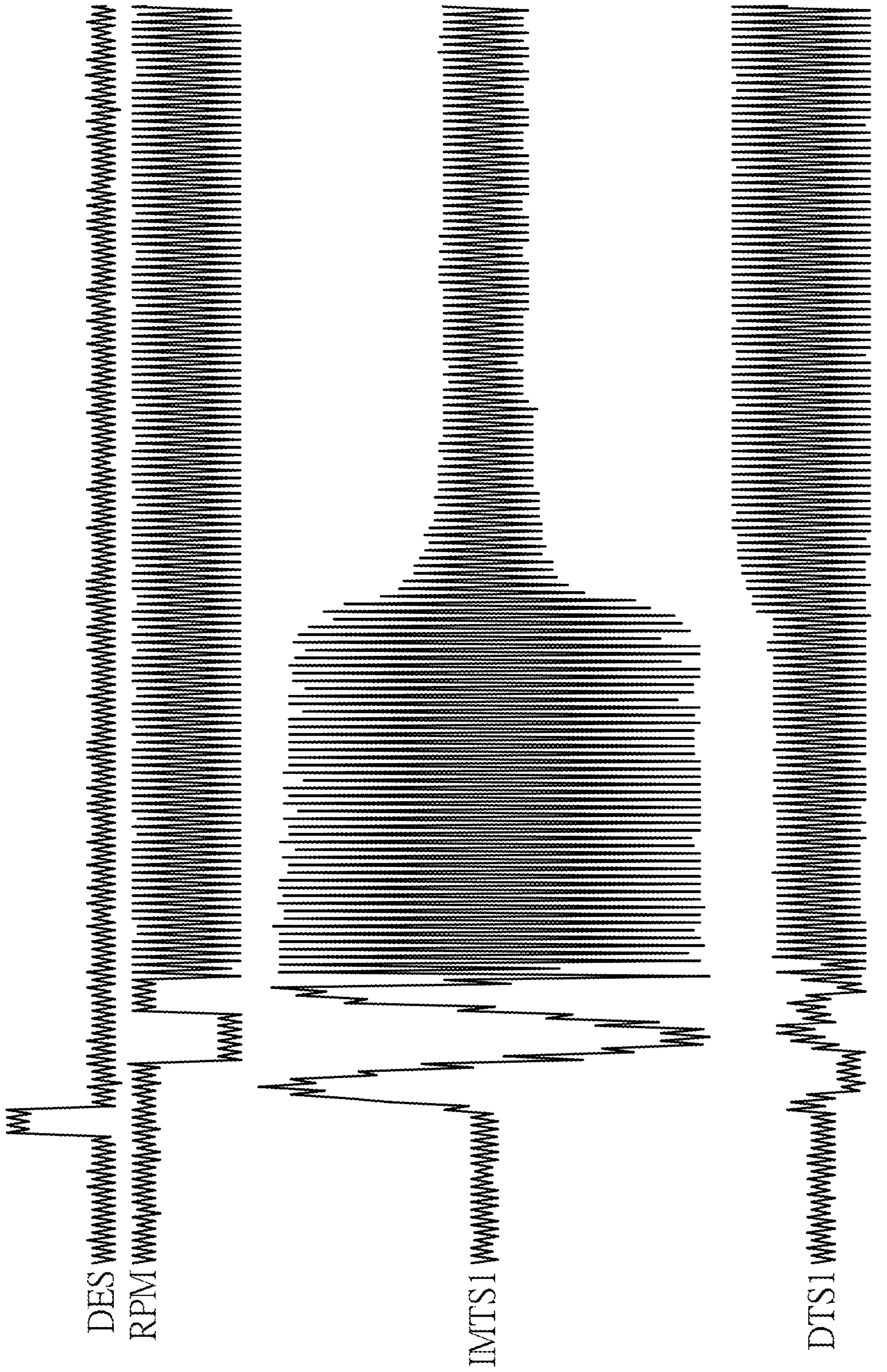
FIG. 11 is a waveform diagram of signals generated at a low temperature by the motor driver according to the eighth embodiment of the present disclosure.

Reference is made to FIG. 10 and FIG. 11, in which FIG. 10 is a waveform diagram of signals generated at a room temperature by the motor driver according to an eighth embodiment of the present disclosure, and FIG. 11 is a waveform diagram of signals generated at a low temperature by the motor driver according to the eighth embodiment of the present disclosure.

Time during which a detection instructing signal DES is at a high level as shown in FIG. 10 and FIG. 11 may be used as a sensing time. The temperature sensor TSE of the motor driver of the present disclosure as shown in FIG. 1 or FIG. 4 may, within the sensing time, sense the temperature of the motor MT or the environment around the motor MT.

At the room temperature, the driver circuit DRV of the motor driver of the present disclosure as shown in FIG. 1 or FIG. 4 outputs a driving signal DTS0 shown in FIG. 10 to the motor MT for driving the motor MT to rotate at a rotational speed of a motor rotational speed signal RPM shown in FIG. 10 such that a motor current signal IMTS0 shown in FIG. 10 flows through the motor MT.

At the low temperature, the driver circuit DRV of the motor driver of the present disclosure as shown in FIG. 1 or FIG. 4 outputs a driving signal DTS1 shown in FIG. 11 to the motor MT for driving the motor MT to rotate at the rotational speed of the motor rotational speed signal RPM shown in FIG. 11 such that a motor current signal IMTS1 shown in FIG. 11 flows through the motor MT.

It is worth noting that, the motor MT is more difficult to be driven to rotate at the low temperature than at the room temperature. For example, at the low temperature, lubricating oil is solidified and the mechanical components of the motor MT are stuck together by the solidified lubricating oil, which causes difficulties in driving the motor MT to rotate. Therefore, duty cycles of a plurality of waveforms of the driving signal DTS1 outputted to the motor MT at the low temperature are respectively larger than duty cycles of a plurality of waveforms of the driving signal DTS0 outputted to the motor MT at the room temperature.

At the low temperature, the driver circuit DRV of the motor driver of the present disclosure increases the duty cycles of the plurality of waveforms of the driving signal DTS1 for increasing a current value of a motor current signal IMTS1 flowing through the motor MT. As a result, at the low temperature, sufficient thrust force is applied on the motor MT such that the motor MT is successfully started up. Furthermore, the rotational speed of the motor MT at the low temperature is able to reach the rotational speed of the same at the room temperature.

In conclusion, the present disclosure provides the motor driver for setting the duty cycles based on the temperature. The motor driver of the present disclosure, according the sensed temperature of the motor or the environment around the motor, modulates the driving signal outputted to the motor for adjusting the thrust force applied on the motor. In particular, when the lubricant between the mechanical components such as the bearings and the balls of the motor is solidified and the mechanical components are stuck together by the solidified lubricant at the low temperature, the motor driver of the present disclosure applies a much larger thrust force on the motor for successfully starting up the motor and driving the motor to rotate.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor driver for setting duty cycles based on a temperature, comprising:

a temperature sensor configured to sense a temperature of a motor or an environment around the motor as a sensed temperature, and configured to output a temperature sensed signal according to the sensed temperature;

a temperature duty cycle modulating circuit connected to the temperature sensor, and configured to output a duty cycle modulation instructing signal according to the temperature sensed signal;

a startup duty cycle setting circuit connected to the temperature duty cycle modulating circuit, configured to modulate a preset duty cycle to form a startup duty cycle according to the duty cycle modulation instructing signal, and configured to output a startup duty cycle instructing signal according to the startup duty cycle;

a startup signal generating circuit connected to the startup duty cycle setting circuit, and configured to set or modulate duty cycles of one or more of a plurality of waveforms of a startup signal to be equal to the startup duty cycle according to the startup duty cycle instructing signal; and a driver circuit connected to the startup signal generating circuit, and configured to output a driving signal to the motor according to the startup signal.

2. The motor driver according to claim 1, wherein the temperature duty cycle modulating circuit is configured to calculate a temperature difference between the sensed temperature instructed by the temperature sensed signal and a temperature threshold, set a duty cycle modulation value corresponding to the temperature difference, and output the startup duty cycle instructing signal according to the duty cycle modulation value.

3. The motor driver according to claim 2, wherein, when the sensed temperature is lower than the temperature threshold, the startup duty cycle setting circuit modulates the preset duty cycle to form the startup duty cycle according to the duty cycle modulation instructing signal.

4. The motor driver according to claim 3, wherein, when the sensed temperature is not lower than the temperature threshold, the startup duty cycle setting circuit does not modulate the preset duty cycle and directly sets the preset duty cycle as the startup duty cycle according to the duty cycle modulation instructing signal.

5. The motor driver according to claim 2, wherein the temperature duty cycle modulating circuit is configured to set a plurality of reference modulation temperatures and a plurality of reference modulation duty cycles, the plurality of reference modulation duty cycles respectively correspond to the plurality of reference modulation temperatures, and the temperature duty cycle modulating circuit is configured to output the duty cycle modulation instructing signal according to the reference modulation duty cycle corresponding to the reference modulation temperature being equal to the temperature difference.

6. The motor driver according to claim 1, wherein the startup duty cycle setting circuit is configured to modulate an initial duty cycle to form an initial startup duty cycle according to the duty cycle modulation instructing signal, and a duty cycle of an earliest one or each of earliest ones of the plurality of waveforms of the startup signal outputted by the startup signal generating circuit is equal to the initial startup duty cycle.

7. The motor driver according to claim 1, wherein the startup duty cycle setting circuit is configured to modulate a final duty cycle to form a final startup duty cycle according to the duty cycle modulation instructing signal, and a duty cycle of a latest one or each of latest ones of the plurality of waveforms of the startup signal outputted by the startup signal generating circuit is equal to the final startup duty cycle.

8. The motor driver according to claim 1, further comprising:

a waveform pattern generating circuit connected to the startup signal generating circuit, configured to modulate a plurality of reference pattern waveform signals from the waveform pattern generating circuit according to the startup duty cycle instructing signal, and configured to output the startup signal according to the plurality of reference pattern waveform signals.

9. The motor driver according to claim 1, further comprising:

an oscillation signal generating circuit connected to the driver circuit and configured to output an oscillation signal, wherein the driver circuit is configured to compare voltage levels of the oscillation signal with voltage levels of the startup signal to determine duty cycles of a plurality of waveforms of the driving signal.

10. A motor driving method for setting duty cycles based on a temperature, comprising processes of:

sensing a temperature of a motor or an environment around the motor as a sensed temperature to output a temperature sensed signal;

outputting a duty cycle modulation instructing signal according to the temperature sensed signal;

modulating a preset duty cycle to form a startup duty cycle according to the duty cycle modulation instructing signal;

outputting a startup duty cycle instructing signal according to the startup duty cycle;

setting or modulating duty cycles of one or more of a plurality of waveforms of a startup signal to be equal to the startup duty cycle according to the startup duty cycle instructing signal; and outputting a driving signal to the motor according to the startup signal.

11. The motor driving method according to claim 10, further comprising processes of:

calculating a temperature difference between the sensed temperature instructed by the temperature sensed signal and a temperature threshold;

setting a duty cycle modulation value corresponding to the temperature difference; and outputting the startup duty cycle instructing signal according to the duty cycle modulation value.

12. The motor driving method according to claim 11, further comprising processes of:

setting a plurality of reference modulation temperatures and a plurality of reference modulation duty cycles, wherein the plurality of reference modulation duty cycles respectively correspond to the plurality of reference modulation temperatures; and outputting the duty cycle modulation instructing signal according to the reference modulation duty cycle corresponding to the reference modulation temperature being equal to the temperature difference.

13. The motor driving method according to claim 10, further comprising a process of:

when the sensed temperature is lower than the temperature threshold, modulating the preset duty cycle such that the preset duty cycle is increased to form the startup duty cycle according to the duty cycle modulation instructing signal.

14. The motor driving method according to claim 10, further comprising a process of:

when the sensed temperature is not lower than the temperature threshold, directly setting the preset duty cycle as the startup duty cycle without modulating the preset duty cycle according to the duty cycle modulation instructing signal.

15. The motor driving method according to claim 10, further comprising processes of:

modulating an initial duty cycle to form an initial startup duty cycle according to the duty cycle modulation instructing signal; and setting a duty cycle of an earliest one or each of earliest ones of the plurality of waveforms of the startup signal to be equal to the initial startup duty cycle.

16. The motor driving method according to claim 10, further comprising processes of:

modulating a final duty cycle to form a final startup duty cycle according to a final duty cycle instructed by the duty cycle modulation instructing signal; and setting a duty cycle of a latest one or each of latest ones of the plurality of waveforms of the startup signal to be equal to the final startup duty cycle.

17. The motor driving method according to claim 10, further comprising a process of:

modulating a plurality of reference pattern waveform signals to output the startup signal according to the startup duty cycle.

18. The motor driving method according to claim 10, further comprising a process of:

comparing voltage levels of an oscillation signal with voltage levels of the startup signal to determine duty cycles of a plurality of waveforms of the driving signal.

* * * * *